United States Patent
Chi et al.

(10) Patent No.: US 8,501,627 B2
(45) Date of Patent: Aug. 6, 2013

(54) PROFILE CONTROL IN DIELECTRIC ETCH

(75) Inventors: Kyeong-Koo Chi, San Jose, CA (US); Jonathan Kim, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 419 days.

(21) Appl. No.: 12/679,008

(22) PCT Filed: Sep. 16, 2008

(86) PCT No.: PCT/US2008/076542
§ 371 (c)(1),
(2), (4) Date: Nov. 11, 2010

(87) PCT Pub. No.: WO2009/042453
PCT Pub. Date: Apr. 2, 2009

(65) Prior Publication Data
US 2011/0053379 A1    Mar. 3, 2011

Related U.S. Application Data

(60) Provisional application No. 60/975,752, filed on Sep. 27, 2007.

(51) Int. Cl.
*H01L 21/302*    (2006.01)
(52) U.S. Cl.
USPC ........... 438/700; 438/710; 438/723; 438/733; 216/67
(58) Field of Classification Search
None
See application file for complete search history.

(56) References Cited

U.S. PATENT DOCUMENTS

| | | | |
|---|---|---|---|
| 4,208,241 A | 6/1980 | Harshbarger et al. | |
| 5,376,228 A * | 12/1994 | Yanagida | 438/714 |
| 5,804,088 A | 9/1998 | McKee | |
| 6,057,239 A | 5/2000 | Wang et al. | |
| 6,187,688 B1 | 2/2001 | Ohkuni et al. | |
| 6,287,980 B1 | 9/2001 | Hanazaki et al. | |
| 6,492,263 B1 | 12/2002 | Peng et al. | |
| 6,630,407 B2 | 10/2003 | Keil et al. | |
| 6,635,185 B2 | 10/2003 | Demmin et al. | |
| 6,746,961 B2 | 6/2004 | Ni et al. | |
| 6,797,637 B2 | 9/2004 | Komagata | |

(Continued)

FOREIGN PATENT DOCUMENTS

| | | |
|---|---|---|
| EP | 0 498 209 A1 | 8/1992 |
| EP | 0 498 209 B1 | 8/1992 |

(Continued)

OTHER PUBLICATIONS

International Search Report dated Apr. 28, 2009 for International Application No. PCT/US2008/076542.

(Continued)

*Primary Examiner* — Anita Alanko
(74) *Attorney, Agent, or Firm* — Beyer Law Group LLP

(57) ABSTRACT

A method for etching a dielectric layer is provided. The dielectric layer is disposed over a substrate and below a patterned mask having a line-space pattern. The method includes (a) providing an etchant gas comprising CF4, COS, and an oxygen containing gas, (b) forming a plasma from the etchant gas, and (c) etching the dielectric layer into the line-space pattern through the mask with the plasma from the etchant gas. The gas flow rate of CF4 may have a ratio greater than 50% of a total gas flow rate of all reactive gas components. The gas flow rate of COS may be between 1% and 50%. The method reduces bowing in etching of the dielectric layer by adding COS to the etchant gas.

10 Claims, 8 Drawing Sheets

U.S. PATENT DOCUMENTS

| | | | |
|---|---|---|---|
| 7,566,664 B2 * | 7/2009 | Yan et al. | 438/706 |
| 7,670,759 B2 * | 3/2010 | Morioka | 430/325 |
| 8,133,819 B2 * | 3/2012 | Wang et al. | 438/725 |
| 8,158,524 B2 * | 4/2012 | Chi et al. | 438/706 |
| 2006/0226120 A1 * | 10/2006 | Rusu et al. | 216/67 |
| 2006/0270230 A1 | 11/2006 | Abatchev et al. | |

FOREIGN PATENT DOCUMENTS

| | | | |
|---|---|---|---|
| EP | 0 516 053 | | 12/1992 |
| EP | 0 903 777 | | 3/1999 |
| FR | 2673763 | | 9/1992 |
| JP | 2000-277494 | | 10/2000 |
| JP | 2004-087896 A | | 3/2004 |
| JP | 2004-363150 | | 12/2004 |
| KR | 2002075005 A | * | 10/2002 |
| WO | 97/24750 | | 7/1997 |
| WO | 2006/107495 | | 10/2006 |

OTHER PUBLICATIONS

International Search Report mailed Sep. 11, 2006 for PCT/US2006/008302.

Written Opinion, mailed Sep. 11, 2006 for PCT/US2006/008302.

Office Action dated Apr. 6, 2007 for U.S. Appl. No. 11/095,932.

Office Action dated Sep. 24, 2007 for U.S. Appl. No. 11/095,932.

Office Action dated Jul. 28, 2008 from U.S. Appl. No. 11/095,932.

Written Opinion dated Dec. 1, 2008 from Singapore Patent Application No. 200708501-2.

Search Report dated Dec. 1, 2008 from Singapore Patent Application No. 200708501-2.

International Search Report dated Feb. 23, 2009 from International Patent Application No. PCT/US2008/076435.

Written Opinion dated Feb. 23, 2009 from International Patent Application No. PCT/US2008/076435.

Office Action dated Mar. 6, 2009 from U.S. Appl. No. 11/095,932.

Notice of Allowance dated Aug. 26, 2009 from U.S. Appl. No. 11/095,932.

Office Action dated Sep. 19, 2011 from U.S. Appl. No. 12/210,777.

Notice of Allowance dated Jan. 25, 2012 from U.S. Appl. No. 12/210,777.

* cited by examiner

*PRIOR ART* FIG. 3

Table 1

| Etch methods | No COS | +5COS | +10COS |
|---|---|---|---|
| Top CD (nm) | 40.3 | 43.2 | 43.2 |
| Middle CD (nm) | 36.6 | 41.1 | 43.2 |
| Bow (nm) | 3.7 | 2.1 | 0 |

FIG. 8

PROFILE CONTROL IN DIELECTRIC ETCH

CROSS REFERENCE TO RELATED APPLICATIONS

This application claims priority under 35 U.S.C. §119(e) from U.S. Provisional Application No. 60/975,752, entitled "PROFILE CONTROL IN DIELECTRIC ETCH", filed Sep. 27, 2007, and naming Chi Kyeong-Koo and Jonathan Kim as inventors, which is incorporated by reference in its entirety for all purposes.

BACKGROUND OF THE INVENTION

The present invention relates to etching an etch layer through a mask during the production of a semiconductor device. More specifically, the present invention relates to etching a dielectric layer through a line-space patterned mask during the production of semiconductor devices.

During semiconductor wafer processing, features of the semiconductor device are defined in the wafer using well-known patterning and etching processes. In these processes (photolithography), a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

A vertically straight feature profile is necessary to maintain device yield. However, there are several mechanisms to cause deviations from the vertically straight profile: bowing refers to widening in the upper-middle portion of the feature; necking refers to narrowing near the top of the feature; tapering refers to narrowing towards the bottom of the feature; and twisting refers to random deviation of the position and orientation at the bottom of the feature or the distortion of the bottom shape, leading to misalignment to the underlying active devices.

As the integrated circuit dimensions shrinks, the critical dimensions (CDs) and profile control in high aspect ratio feature etching becomes very challenging problem in dielectric etch. Eliminating or reducing profile bowing (bow protection) in vertical profiles is one of such challenging problems. High-aspect ratio (HAR) line-space features have a high ratio of opening depth to opening width. A mask, such as a photoresist mask and/or a hard mask, is used to provide such a line-space pattern. In the specification and claims, a high aspect ratio feature is defined as a feature with a depth to space ratio greater than 10:1.

SUMMARY OF THE INVENTION

To achieve the foregoing and in accordance with the purpose of the present invention, a method for etching a dielectric layer is provided. The dielectric layer is disposed over a substrate and below a patterned mask having a line-space pattern. An etchant gas comprising $CF_4$, COS, hydrofluorocarbon, and an oxygen containing gas is provided. A plasma is formed from the etchant gas. The dielectric layer is etched through the mask with the plasma from the etchant gas so as to have the line-space pattern. The gas flow rate of $CF_4$ may have a ratio greater than 50% of a total gas flow rate of all reactive gas components. The gas flow rate of COS may be between 1% and 50%. The gas flow rate of COS may be preferably between 2% and 20%, and more preferably between 3% and 15% of the gas flow rate of $CF_4$.

In another manifestation of the invention, a method for reducing bowing in etching of a dielectric layer is provided. The dielectric layer is disposed over a substrate and below a patterned mask having a line-space pattern. An etchant gas comprising $CF_4$, COS, hydrofluorocarbon and an oxygen containing gas is provides. A gas flow rate of $CF_4$ has a ratio greater than 50% of a total gas flow rate of all reactive gas components, and a gas flow rate of COS has a ratio between 3% and 15% of the gas flow rate of $CF_4$. A plasma is formed from the etchant gas. The dielectric layer is etched through the mask with the plasma from the etchant gas so as to have a line-space pattern.

In yet another manifestation of the invention, an apparatus for etching a dielectric layer is provided. The dielectric layer being disposed over a substrate and below a patterned mask having a line-space. The apparatus comprises a plasma processing chamber, an etchant gas source, and a controller. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. The etchant gas source is in fluid connection with the gas inlet, and comprises a $CF_4$ source, a COS source, and a oxygen containing gas source. The controller is controllably connected to the gas source and the at least one electrode. The controller comprises at least one processor, and computer readable media comprising computer readable code for etching the dielectric layer into the line-space pattern through the mask. The computer readable code for etching the dielectric layer comprises computer readable code for providing an etchant gas comprising $CF_4$, COS, a hydrofluorocarbon source and an oxygen containing gas from the etchant gas source, computer readable code for generating an etching plasma from the etchant gas, and computer readable code for stopping the etchant gas from the etchant gas source. The computer readable code for etching the dielectric layer further include computer readable code for removing the mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 8 shows a comparison table of the profiles depending on the amount of COS additive in accordance with another example of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
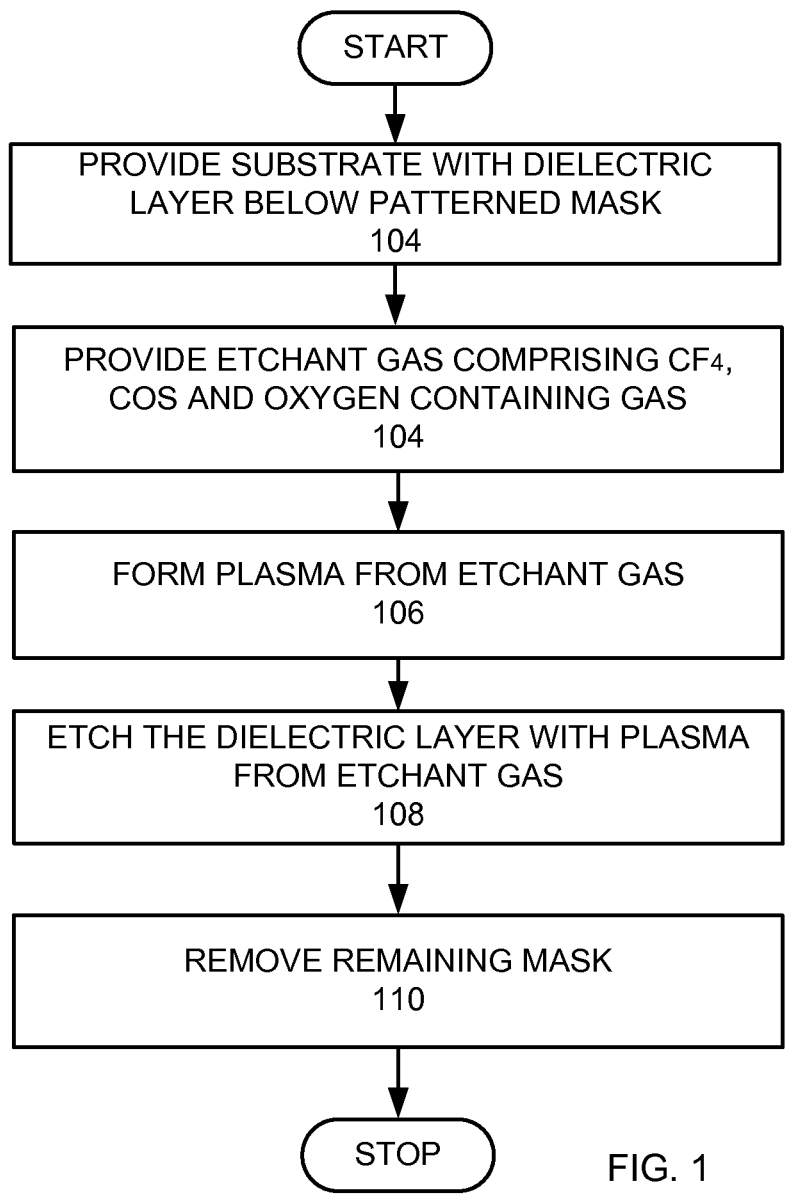
FIG. 1 is a high level flow chart of a process for etching a dielectric layer in accordance with an embodiment of the invention.
Figure 2:
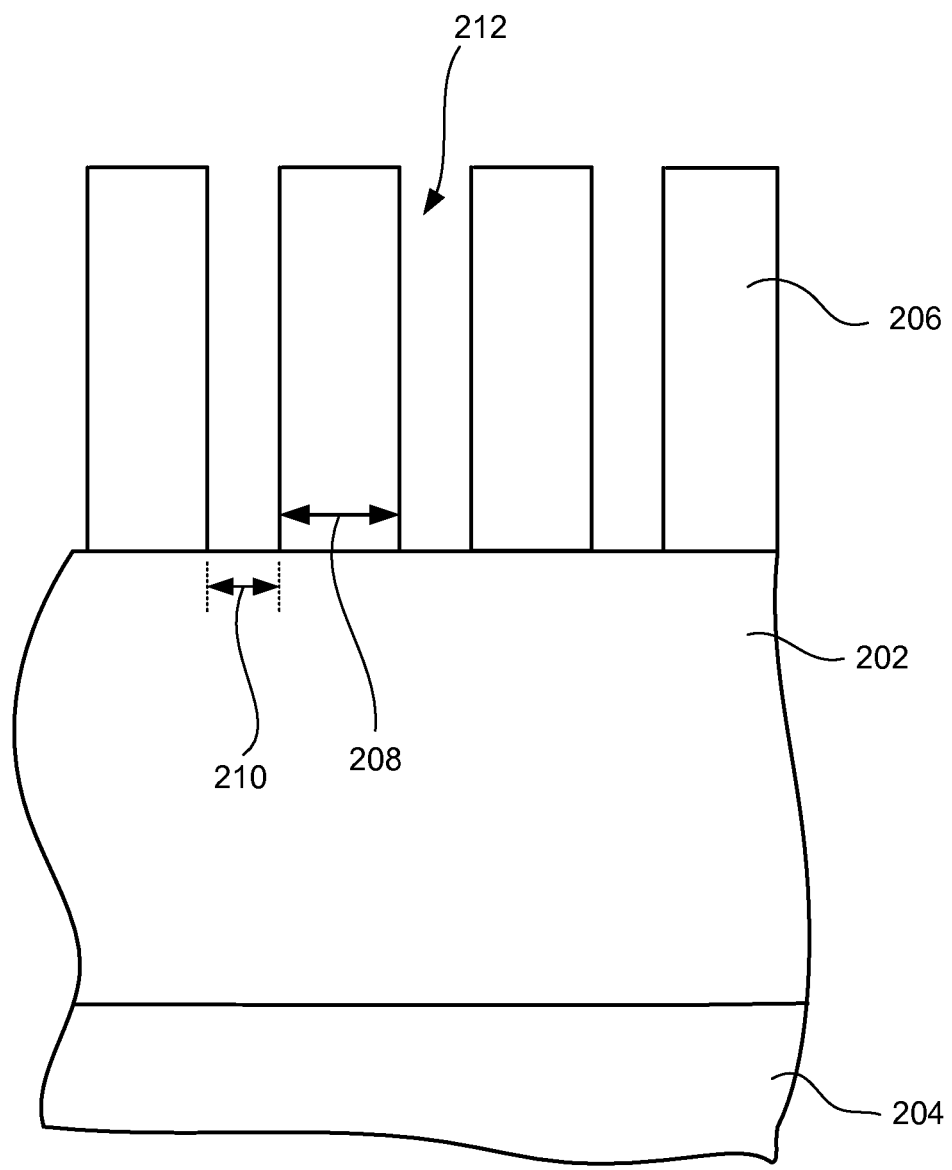
FIG. 2 is a schematic cross-sectional view of the dielectric layer disposed over the substrate and below a patterned mask in an embodiment of the present invention.

To facilitate understanding, FIG. 1 is a high level flow chart of a process for etching a dielectric layer in accordance with an embodiment of the invention. A substrate with a dielectric layer disposed below a patterned mask is provided (step 102). To facilitate understanding of the invention, FIG. 2 is a schematic cross-sectional view of the dielectric layer 202 disposed over the substrate 204 and below the patterned mask 206. The patterned mask 206 includes a line-space pattern, for example, a plurality of lines where the mask material is formed, and grooves between the lines where the mask material has been removed by the patterning. In this embodiment of the invention, the substrate 204 is a silicon wafer and the dielectric layer 202 is a silicon oxide based dielectric material such as $SiO_2$, silicon nitride (SiN), or tetora-ethyl-ortho-silicate (TEOS). The patterned mask 206 may be a carbon based mask such as amorphous carbon mask, a photoresist mask, spin-on coating polymers, or the like. Amorphous carbon is similar to a polymer, but with less hydrogen and more carbon since it is deposited at high temperature greater than 200° C. by CVD, and thus it is more etch resistant than polymer. In a specific example, the mask 206 of amorphous carbon may have a thickness of about 220 nm and the dielectric layer 202 of TEOS may have a thickness of about 210 nm. The width 208 of the line pattern (horizontal thickness at the bottom portion) of the patterned mask 206 is about 54 nm, and the width 210 of the spaces 212 (openings) at the bottom portion of the mask 206 is about 20 nm. Thus, the mask feature of the patterned mask 206 has a high aspect ratio of about 10:1 or more. In accordance with an example of the invention, etching of the dielectric layer 202 may be performed in the same plasma processing chamber that used for patterning the mask 206.

Figure 3:
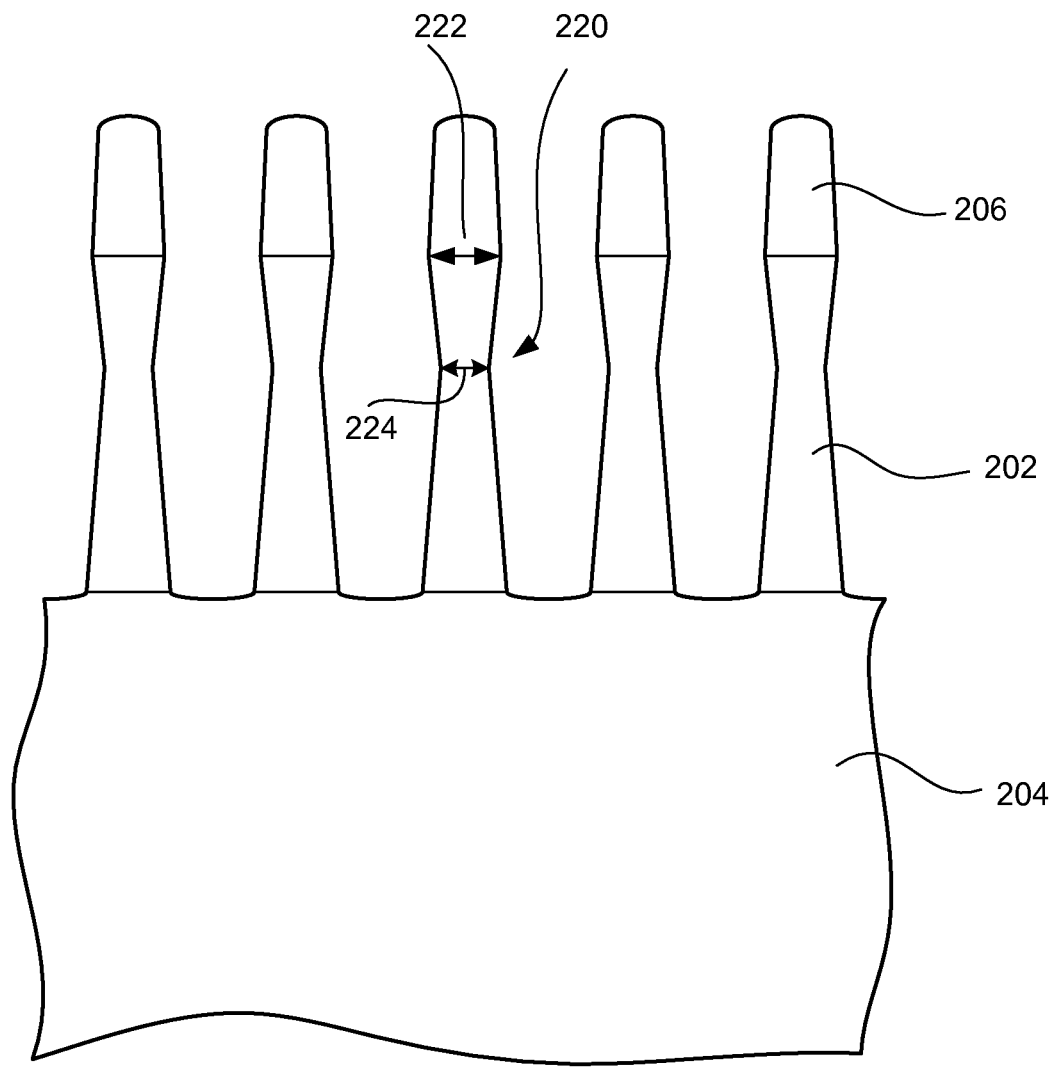
FIG. 3 is a cross-sectional view of the substrate with the dielectric layer which is patterned using a conventional etchant gas.

FIG. 3 schematically illustrates, for comparison, a cross-sectional view of the substrate 204 with the dielectric layer 202 which is patterned using a conventional etchant gas of $CF_4$ and $O_2$ with Ar as a carrier gas. Part of the patterned mask 206 is still remaining on the top of the patterned dielectric layer (etched feature) 202. As shown in FIG. 3, such a conventional dielectric etch may cause bowing 220 in the profile of the etched dielectric layer 202. In this example of conventional etching, the width 222 of the top CD of the etched dielectric layer is 40.3 nm, the width 224 of the middle CD (narrowed portion) of the dielectric layer is 36.6 nm, resulting in a bowing amount of 3.7 nm. The applicant has found that the bowed profiles of dielectric layer can be greatly improved by adding COS to the etchant gas. Accordingly, as shown in FIG. 1, an etchant gas comprising $CF_4$, COS, and an oxygen containing gas is provided (step 104) in accordance with one embodiment of the present invention. The etchant gas may also contain hydrofluorocarbon and/or hydrocarbon.

Figure 4:
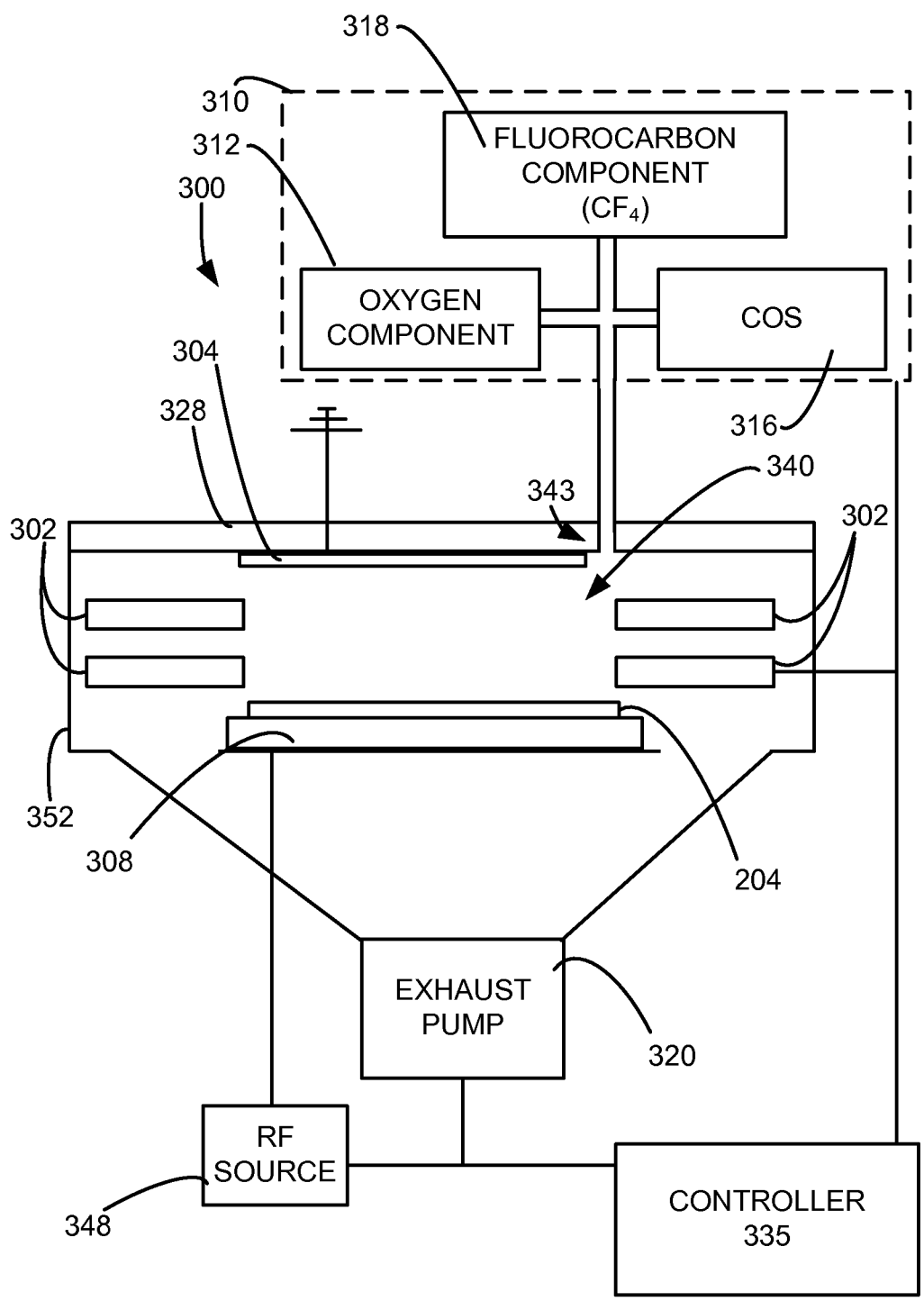
FIG. 4 is a schematic view of a plasma processing chamber that may be used for etching in one embodiment of the present invention.

FIG. 4 is a schematic view of a plasma processing chamber 300 that may be used for inventive etching. The plasma processing chamber 300 comprises confinement rings 302, an upper electrode 304, a lower electrode 308, a gas source 310, and an exhaust pump 320 connected to a gas outlet. Within plasma processing chamber 300, the substrate 204 is positioned upon the lower electrode 308. The lower electrode 308 incorporates a suitable substrate chucking mechanism (e.g., electrostatic, mechanical clamping, or the like) for holding the substrate 204. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. Besides helping to exhaust the gas, the exhaust pump 320 helps to regulate pressure. In this embodiment, the gas source 310 comprises a COS source 312, an $O_2$ source 316, and a fluorocarbon component (such as $CF_4$) source 318. The gas source 310 may also comprises a hydrofluorocarbon and/or hydrocarbon component source (not shown). The gas source 310 may further comprise other gas sources, such a carrier gas source, and gas sources for other processes performed in the processing chamber 300.

As shown in FIG. 4, an RF source 348 is electrically connected to the lower electrode 308. Chamber walls 352 surround the confinement rings 302, the upper electrode 304, and the lower electrode 308. The RF source 348 may comprise a 2 MHz power source, a 60 MHz power source, and optionally a 27 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the RF power source 348 connected to the lower electrode, and the upper electrode is grounded. A controller 335 is controllably connected to the RF source 348, exhaust pump 320, and the gas source 310.

Figure 5A:
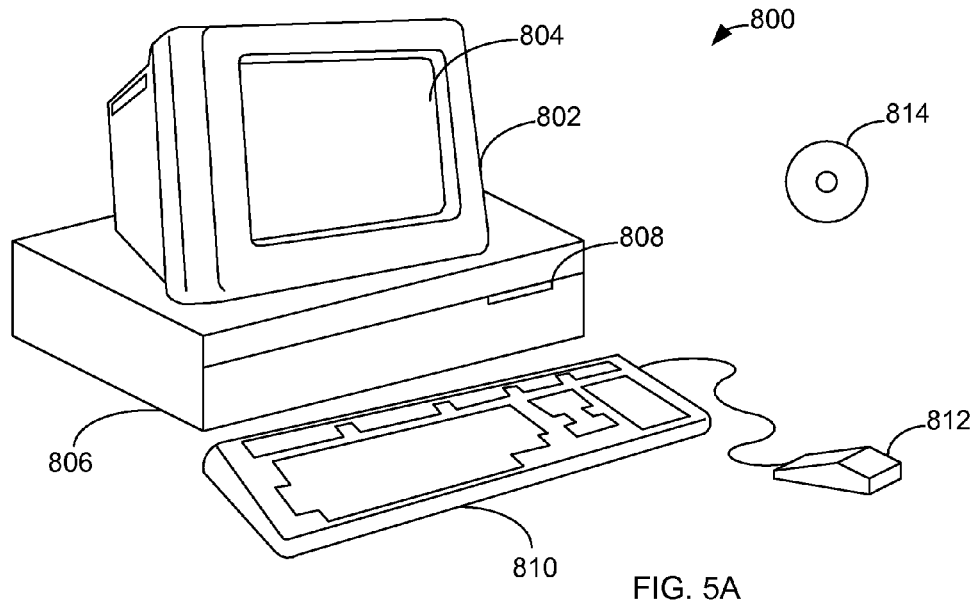
FIGS. 5A-B illustrate a computer system, which is suitable for implementing a controller used in embodiments of the present invention.
Figure 5B:
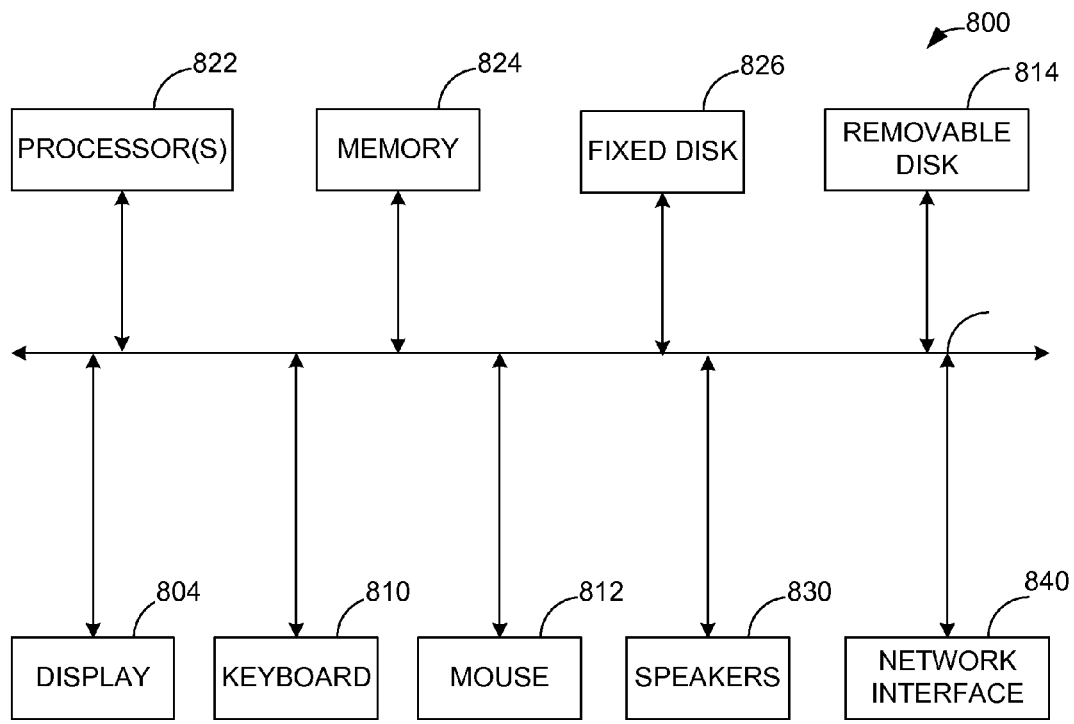

FIGS. 5A and 5B illustrate a computer system 800, which is suitable for implementing a controller 335 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 5B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an embodiment of the invention, the etchant gas comprises COS, a fluorocarbon component, preferably $CF_4$, an oxygen containing gas, and an inert gas (carrier gas) such as Ar. The etchant gas may also contain a hydrofluorocarbon and/or hydrocarbon gas, and $CH_3$, $CHF_3$, and/or $CH_2F_2$ may be used in addition to $CF_4$ as fluorocarbon component in other embodiments. The carrier gas may also be Ar, Xe, or He. The etchant gas is introduced through holes in the top electrode 304 to the plasma region and dissociated to reactive plasma by the RF powers applied to the powered electrode 308. Preferably, the gas flow rate of $CF_4$ has a ratio greater than 50% of a total gas flow rate of all reactive gas components, where the reactive gas components are gases participate in the etching of the dielectric layer, typically all gasses other than the inert carrier gas. In addition, a gas flow rate of COS is preferably between 1% and 50% of the gas flow rate of $CF_4$, and more preferably, the gas flow rate of COS is between 2% and 20% of the gas flow rate of $CF_4$. In one preferable embodiment, the gas flow rate of COS may be between 3% and 15% of the gas flow rate of $CF_4$. In accordance with a preferable embodiment of the present invention, the etchant gas recipe may have 10 sccm COS, 135 sccm $CF_4$, 6 sccm $O_2$, and 1200 sccm Ar.

Referring back to FIG. 1, a plasma is formed from the etchant gas (step 106). In this example, the pressure in the plasma chamber is set at 70 mTorr. The RF source provides 250 Watts at 60 MHz and 250 Watts at 2 MHz. The plasma from the etchant gas is used to etch the line-space pattern into the dielectric layer 202, as shown in FIG. 2B (step 108). An ashing process may be used to remove the remaining mask 206, while the substrate 204 is in the plasma processing chamber (step 110).

In this example, the dielectric layer 202 is etched into the features having a high aspect ratio. In the specification and claims, a high aspect ratio feature is a feature with a height to width aspect ratio of at least 10:1.

Figure 6:
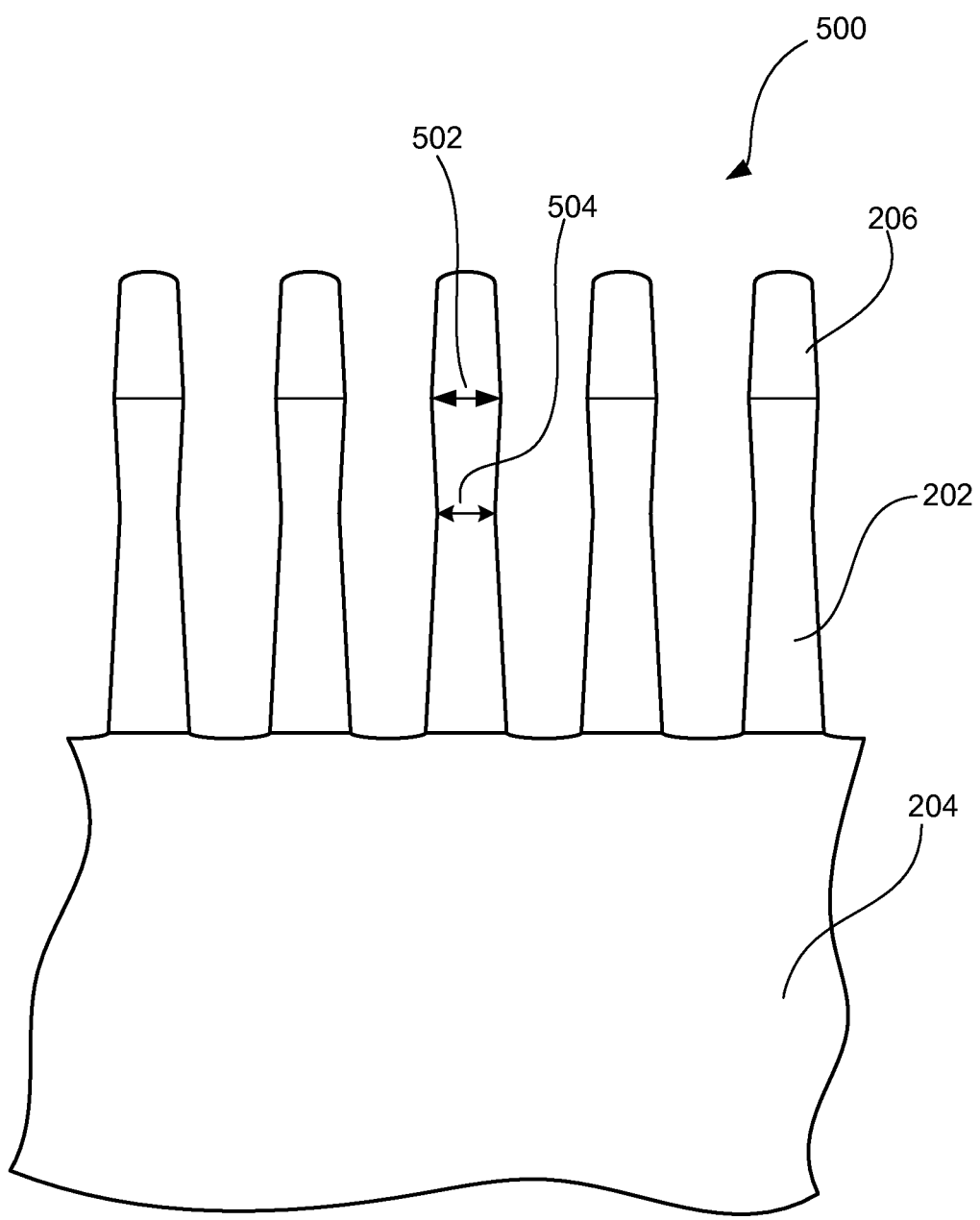
FIG. 6 is a profile of line-space features etched using an etchant gas with COS in accordance with an example of the present invention.
Figure 7:
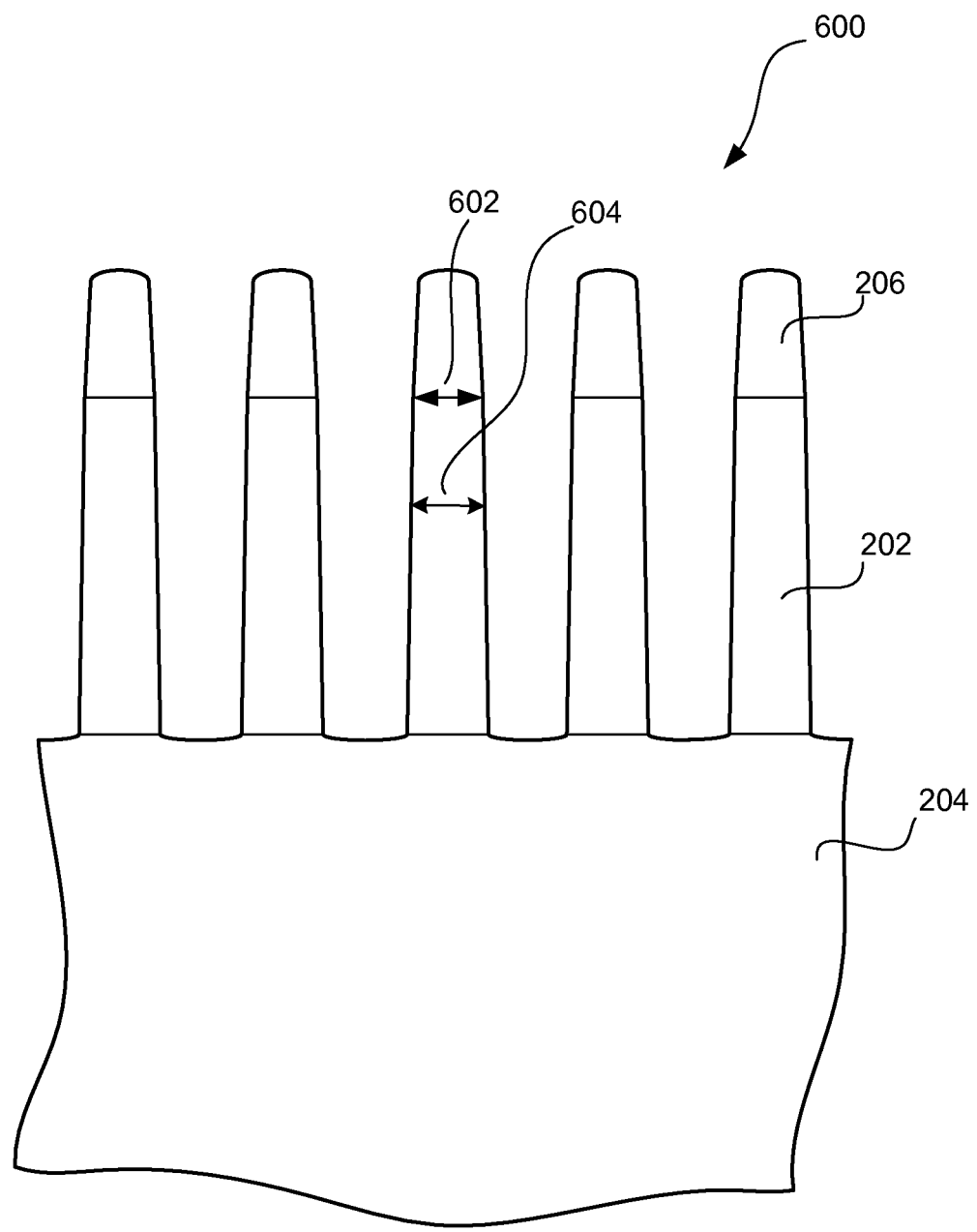
FIG. 7 is another profile of line-space features etched using an etchant gas with COS.

An etch using a plasma chemistry using an etchant gas of an $Ar/CF_4/O_2$ with COS chemistry was performed and compared with an etch with a conventional etchant gas of an $Ar/CF_4/O_2$ chemistry without COS for etching a TEOS based dielectric layer. FIG. 6 shows the profile of line-space features 500 etched using the above etchant gas with COS. In a specific example, the etchant gas includes 5 sccm COS, 135 sccm $CF_4$, 6 sccm $O_2$, and 1200 sccm Ar, with etch time of 132 seconds. In this example, the width 502 of the top CD of the etched dielectric layer is 43.2 nm, the width 504 of the middle CD (narrowed portion) of the etched dielectric layer is 41.1 nm, resulting in a bowing amount of 2.1 nm. FIG. 6 shows the profile of line-space features 600 etched using the above etchant gas with increase amount of COS. In this example, the etchant gas includes 10 sccm COS, 135 sccm $CF_4$, 6 sccm $O_2$, and 1200 sccm Ar, with etch time of 148 seconds. In this example, the width 602 of the top CD of the etched dielectric layer is 43.2 nm, the width 604 of the middle CD (narrowed portion) of the etched dielectric layer is 43.2 nm, resulting in a bowing amount of substantially zero. FIG. 8 shows a comparison table of the profiles depending on the amount of the COS additive.

Without wishing to be bound by theory, it is believed that polymer is formed to protect sidewalls of the features as the feature is formed, where the polymer sidewall helps to reduce bowing. The fluorocarbon (preferably $CF_4$) or hydrofluorocarbon component may be used to provide the sidewall polymer. During a high aspect ratio etch, it is believed that the protective polymer sidewall is etched away at various parts by ion bombardment, which causes the bowing. It is believed that sulfur bonded to carbon, which is added directly to plasma from COS, becomes incorporated into the sidewall polymer and makes the sidewall polymer more resistant to etching.

It is believed that using $CF_4$ as a main etchant is more preferable in etching a line-space pattern in a dielectric layer than using $C_4F_6$ which is typically used to etch via holes or contacts. Compared to $CF_4$ which has a C/F ratio of 1:4, using gases with a higher C/F ratio such as $C_4F_8$ (1:2) or $C_4F_6$ (2:3) causes the vertical profile of the lines features more tapered. That is, the width of the bottom of the features (opening) is smaller than the top of the features. Therefore, for controlling the taper in line-space pattern etching, it is preferable to use $CF_4$ as the main etchant. For example, a preferable etchant gas contains $CF_4$ more than 50% of the total flow of the etchants. Of course, the profile and/or CD can also be controlled by additive gases such as $C_xH_y$ or $C_xH_yF_z$.

In other embodiments of the invention, the etch layer may be un-doped or doped silicon dioxide (e.g. TEOS, PE-TEOS, BPSG, FSG etc), silicon nitride (SixNy), or low-k dielectrics, which may be either organic based or silicon oxide based. An example of an organic based low-k dielectric that may be etched using the invention is SiLK. An example of a silicon-oxide low-k dielectric, which may be etched using the invention is organo silicate glass (OSG).

While this invention has been described in terms of several preferred embodiments, there are alterations, permutations modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a dielectric layer, the dielectric layer being disposed over a substrate and below a patterned mask having a line-space pattern, the method comprising:
    providing an etchant gas comprising $CF_4$, COS, and an oxygen containing gas;
    forming a plasma from the etchant gas; and
    etching the dielectric layer into the line-space pattern through the mask with the plasma from the etchant gas, wherein a gas flow rate of $CF_4$ has a ratio greater than 50% of a total gas flow rate of all reactive gas components, and a gas flow rate of COS is between 1% and 50% of the gas flow rate of $CF_4$ so as to reduce bowing in the line-space pattern in the etching of the dielectric layer.

2. The method as recited in claim 1, wherein the gas flow rate of COS is between 2% and 20% of the gas flow rate of $CF_4$.

3. The method as recited in claim 2, wherein the gas flow rate of COS is between 3% and 15% of the gas flow rate of $CF_4$.

4. The method as recited in claim 1, wherein the etchant gas further comprises one of Ar, He, or Xe, or mixture thereof as a carrier gas.

5. The method as recited in claim 1, wherein the etchant gas further comprises a hydrofluorocarbon gas.

6. The method as recited in claim 1, wherein the dielectric layer is one of SiN, $SiO_2$, or tetora-ethyl-ortho-silicate (TEOS).

7. A method for reducing bowing in etching of a dielectric layer, the dielectric layer being disposed over a substrate and below a patterned mask having a line-space pattern, the method comprising:
    providing an etchant gas comprising $CF_4$, COS, and an oxygen containing gas, a gas flow rate of $CF_4$ having a ratio greater than 50% of a total gas flow rate of all reactive gas components, and a gas flow rate of COS having a ratio between 3% and 15% of the gas flow rate of $CF_4$;
    forming a plasma from the etchant gas; and
    etching the dielectric layer into the line-space pattern through the mask with the plasma from the etchant gas.

8. The method as recited in claim 7, wherein the etchant gas further comprises one of Ar, He, or Xe, or mixture thereof as a carrier gas.

9. The method as recited in claim 7, wherein the etchant gas further comprises a hydrofluorocarbon gas.

10. The method as recited in claim 7, wherein the dielectric layer is one of SiN, $SiO_2$, or tetora-ethyl-ortho-silicate (TEOS).

\* \* \* \* \*